(12) United States Patent
Heo et al.

(10) Patent No.: US 7,785,484 B2
(45) Date of Patent: Aug. 31, 2010

(54) MASK TRIMMING WITH ARL ETCH

(75) Inventors: Dongho Heo, Fremont, CA (US); Supriya Goyal, Emeryville, CA (US); Jisoo Kim, Pleasanton, CA (US); S. M. Reza Sadjadi, Saratoga, CA (US)

(73) Assignee: Lam Research Corporation, Fremont, CA (US)

( * ) Notice: Subject to any disclaimer, the term of this patent is extended or adjusted under 35 U.S.C. 154(b) by 543 days.

(21) Appl. No.: 11/841,209

(22) Filed: Aug. 20, 2007

(65) Prior Publication Data

US 2009/0050603 A1 Feb. 26, 2009

(51) Int. Cl.
*B44C 1/22* (2006.01)
*C03C 15/00* (2006.01)
*C03C 25/68* (2006.01)
*C23F 1/00* (2006.01)

(52) U.S. Cl. ............................ 216/47; 216/41; 438/689; 438/694; 438/725

(58) Field of Classification Search .................... 216/47, 216/41; 438/689, 725, 694
See application file for complete search history.

(56) References Cited

U.S. PATENT DOCUMENTS

| | | | |
|---|---|---|---|
| 6,150,678 A | 11/2000 | Tung et al. | |
| 6,599,437 B2 * | 7/2003 | Yauw et al. | 216/47 |
| 7,018,780 B2 | 3/2006 | Vahedi et al. | |
| 7,053,003 B2 | 5/2006 | Kanarik et al. | |
| 7,094,613 B2 | 8/2006 | Mui et al. | |
| 7,241,683 B2 | 7/2007 | Hudson et al. | |
| 2004/0224520 A1 | 11/2004 | Yun et al. | |
| 2007/0075038 A1 | 4/2007 | Sadjadi et al. | |

FOREIGN PATENT DOCUMENTS

WO WO 00/24048 4/2000

OTHER PUBLICATIONS

International Search Report dated Jan. 28, 2009 from International Application No. PCT/US2008/073601.
Written Opinion dated Jan. 28, 2009 from International Application No. PCT/US2008/073601.
Lam Research Corporation, "Lam Research Corporation's 2300® Motif™ Post-lithography Pattern Enhancement System Breaks Advanced Lithography Barrier", http://biz.yahoo.com/bw/070619/20070619006161.html?.v=1 , Jun. 19, 2007.

* cited by examiner

*Primary Examiner*—Roberts Culbert
(74) *Attorney, Agent, or Firm*—Beyer Law Group LLP

(57) ABSTRACT

A method for etching a dielectric layer disposed below an antireflection layer (ARL) is provided. The method comprises (a) forming a patterned mask with mask features over the ARL, the mask having isolated areas and dense areas of the mask features, (b) trimming and opening, and (c) etching the dielectric layer using the trimmed mask. The trimming and opening comprises a plurality of cycles, where each cycle includes (b1) a trim-etch phase which etches the ARL in a bottom of the mask features and selectively trims the isolated areas of the mask with respect to the dense areas, and (b2) a deposition-etch phase which deposits a deposition layer on the mask while further etching the ARL in the bottom of the mask features. The trimming and opening result in a net trimming of the mask in the isolated areas.

14 Claims, 11 Drawing Sheets

MASK TRIMMING WITH ARL ETCH

BACKGROUND OF THE INVENTION

The present invention relates to the formation of semiconductor devices. More specifically, the present invention relates to etching process for dielectric layers.

During semiconductor wafer processing, features of the semiconductor device are defined in the wafer using well-known patterning and etching processes. In these processes (photolithography), a photoresist (PR) material is deposited on the wafer and then is exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

Argon-fluoride (ArF) excimer laser having wavelength of 193 nm (ArF lithography technology) has been used to for the production of sub 0.04 µm devices. This immersion lithography technology enables processes below the 110 nm node. Such small features in most highly integrated circuits require higher resolution and thus a thinner photoresist because of the depth-of-focus (depth-of-field) limitations of the patterning image. For example, the ArF lithography for certain DRAM processes, such as Bitline, uses a very thin photoresist with a thickness less than 100 nm. The photoresist material is also softer and weak, and such a thin photoresist would easily and undesirably be etched during a plasma etching process for one or more antireflective coating (ARC) layers, such as the bottom antireflective coating (BARC) and silicon oxynitride (SiON) layers, after patterning of the photoresist. Thus, it has been one of the major challenges in the short-wavelength lithography to manage the "etch budget" and prevent surface degradation of the photoresist, while achieving target critical dimensions (CD). Here, "etch budget" is typically the amount of time during which an exposed structure (the photoresist in this case) can be subjected to etchant without undue damages.

In addition, an ideal etching process must accurately transfer the pattern on the mask to an underlying layer to be etched. However, since the etching process removes a target material both chemically and physically, the etching process is very sensitive to various environmental parameters. One of such factors in conventional etching control is the micro-loading effect, in which the characteristics of the etching differ under the variation of size and density of the pattern (feature), i.e., the variation of the "loading", of a layer to be etched (an etch layer).

SUMMARY OF THE INVENTION

To achieve the foregoing and in accordance with the purpose of the present invention a method for etching a dielectric layer disposed below an antireflection layer (ARL) is provided. The method comprises (a) forming a patterned mask with mask features over the ARL, the mask having isolated areas and dense areas of the mask features, (b) trimming and opening, and (c) etching the dielectric layer using the trimmed mask. The trimming and opening comprises a plurality of cycles, where each cycle includes (b1) a trim-etch phase which etches the ARL in a bottom of the mask features and selectively trims the isolated areas of the mask with respect to the dense areas, and (b2) a deposition-etch phase which deposits a deposition layer on the mask while further etching the ARL in the bottom of the mask features. The trimming and opening result in a net trimming of the mask in the isolated areas.

In another manifestation of the invention an apparatus for etching a dielectric layer disposed below an antireflection layer (ARL) and a patterned mask with mask features formed over the ARL is provided. The mask having isolated areas and dense areas of the mask features. The apparatus is provided with a plasma processing chamber which includes a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure. A gas source is in fluid connection with the gas inlet, and comprises a trim-etch gas source, a deposition-etch gas source, and a dielectric layer etch gas source. A controller is controllably connected to the gas source and at least one electrode. The controller includes at least one processor and computer readable media. The computer readable media includes computer readable code for trimming and opening comprising a plurality of cycles, wherein computer readable code for each cycle comprises computer readable code for providing a trim-etch gas from the trim-etch gas source to form a deposition layer, computer readable code for generating a first plasma from the trim-etch gas, the first plasma etching the ARL in a bottom of the mask features and selectively trimming the isolated areas of the mask with respect to the dense areas, computer readable code for stopping the trim-etch gas from the trim-etch gas source, computer readable code for providing a deposition-etch gas from the deposition-etch gas source, computer readable code for generating a second plasma from the deposition-etch gas source, the second plasma depositing a deposition layer on the mask while further etching the ARL in the bottom of the mask features, computer readable code for stopping the deposition-etch gas from the deposition-etch gas source, computer readable code for etching the dielectric layer using the trimmed mask, and computer readable code for removing the mask.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
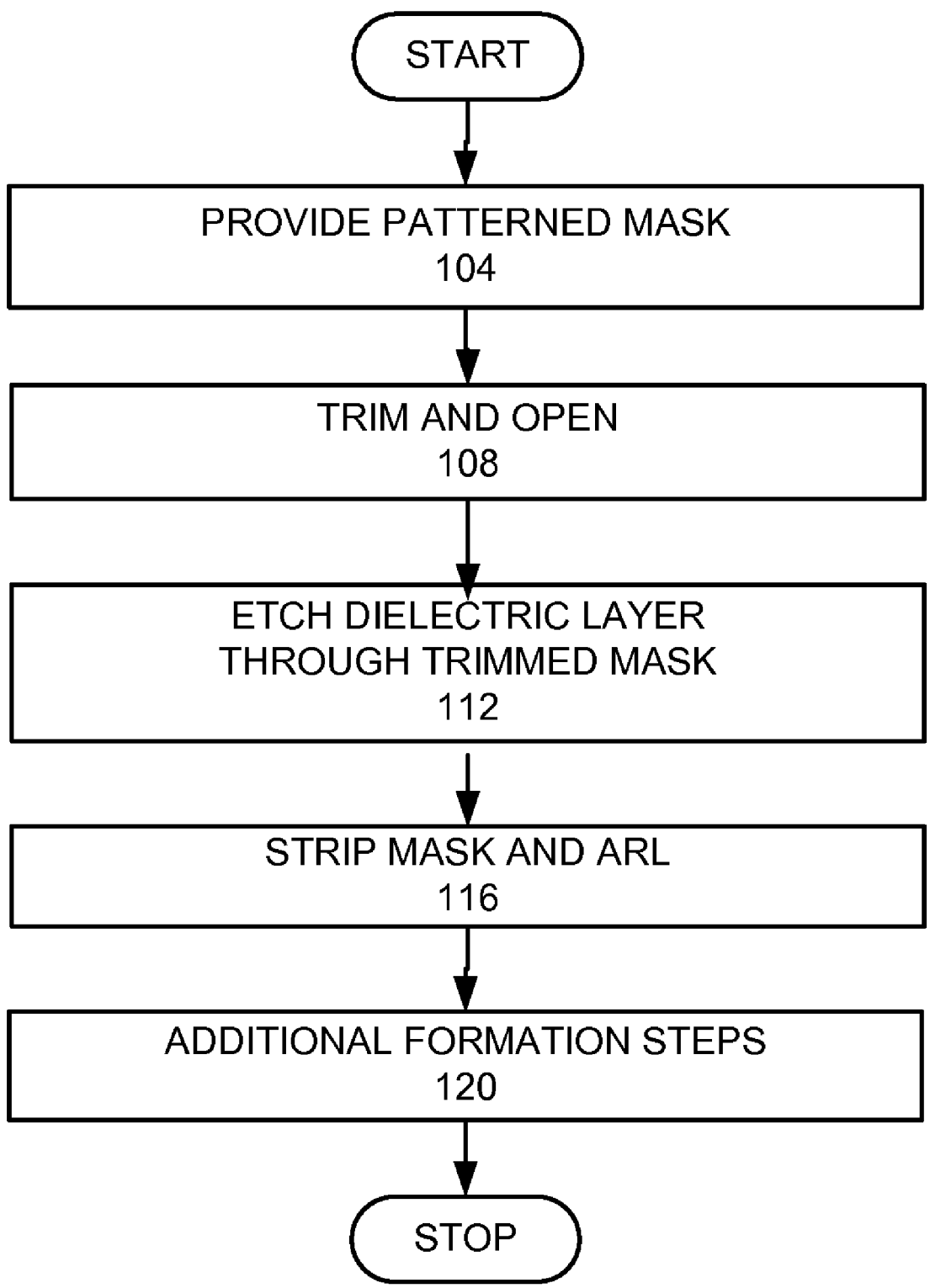
FIG. 1 is a high level flow chart of a process that may be used in an embodiment of the invention.
Figure 2A:
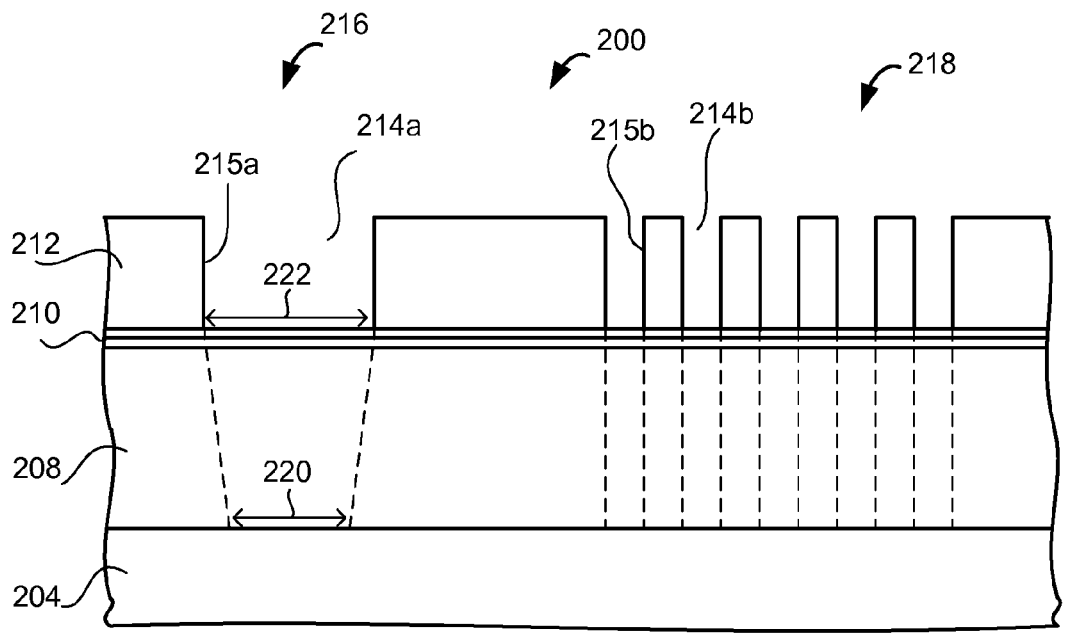
FIGS. 2A-D are schematic cross-sectional views of a stack processed according to an embodiment of the invention.

To facilitate understanding, FIG. 1 is a high level flow chart of a process that may be used in an embodiment of the invention. A patterned mask is provided (step 104) over a dielectric layer which is to be etched. For example, the dielectric layer may be a nitride oxide layer, and the mask may be a photoresist mask. FIG. 2A is a schematic cross-sectional view of the dielectric layer 208 to be etched that is formed over a substrate 204, an antireflective layer (ARL) 210 formed over the dielectric layer 208, and a patterned photoresist mask 212 with a feature 214 that is formed over the ARL 210, forming a stack 200. The ARL 210 may include an organic bottom antireflective coating (BARC) layer and an inorganic dielectric antireflective coating (DARC) layer.

The mask layer 212 is patterned to form mask features 214 (214a, 214b) with mask feature sidewalls 215a, 215b. As shown in FIG. 2A, the patterned mask 212 includes isolated areas 216 and dense areas 218 of the mask features. The isolated areas 216 typically include a smaller number of larger mask features, and the dense areas 218 typically include a larger numbers of smaller mask features. For example, the ratio of the CD of the mask features in the dense areas 128 and that in the isolated areas 126 may be 1:2 to 1:10. That is, the isolated areas 216 are also characterized as areas having large features 214a while the dense areas 218 as areas having small features 214b.

Figure 2B:
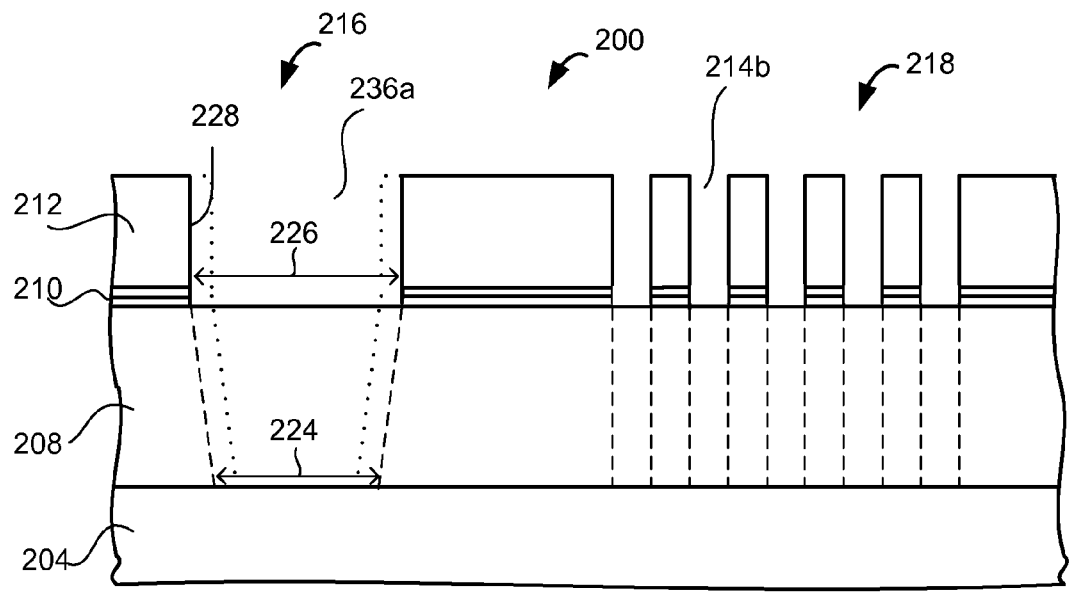

In the isolated areas 216, etching of the dielectric layer 208 tends to slow down, and, as a result, the final CD 220 of the feature, such as a trench, of the dielectric layer 208 is smaller than the original CD 222 of the mask feature 214a. In addition, the patterned mask 212 tends to deteriorate during the etching of the ARL 210 in the bottom of the mask features. Accordingly, in accordance with one embodiment of the present invention, a mask-trimming and bottom-opening (ARL etching) process (step 108 in FIG. 1) is provided before etching of the dielectric layer 208. While the ARL 210 is being etched and removed from the bottom of the mask features during the a mask-trimming and bottom-opening (ARL stripping) process, the sidewall 228 of the mask is selectively trimmed such that the CD 226 of the mask features is enlarged in the isolated areas 216 with respect to the dense areas 218, as shown in FIG. 2B. The mask features in the dense areas 218 and the thickness of the mask layer 212 in both of the isolated areas 216 and the dense areas 218 are substantially preserved by this mask-trimming and bottom opening process. Using the trimmed feature 236a, the final CD 224 of the dielectric layer 208 (in FIG. 2B) would be substantially the same as the original CD 222 of the original mask feature 124a (in FIG. 2A).

Figure 3:
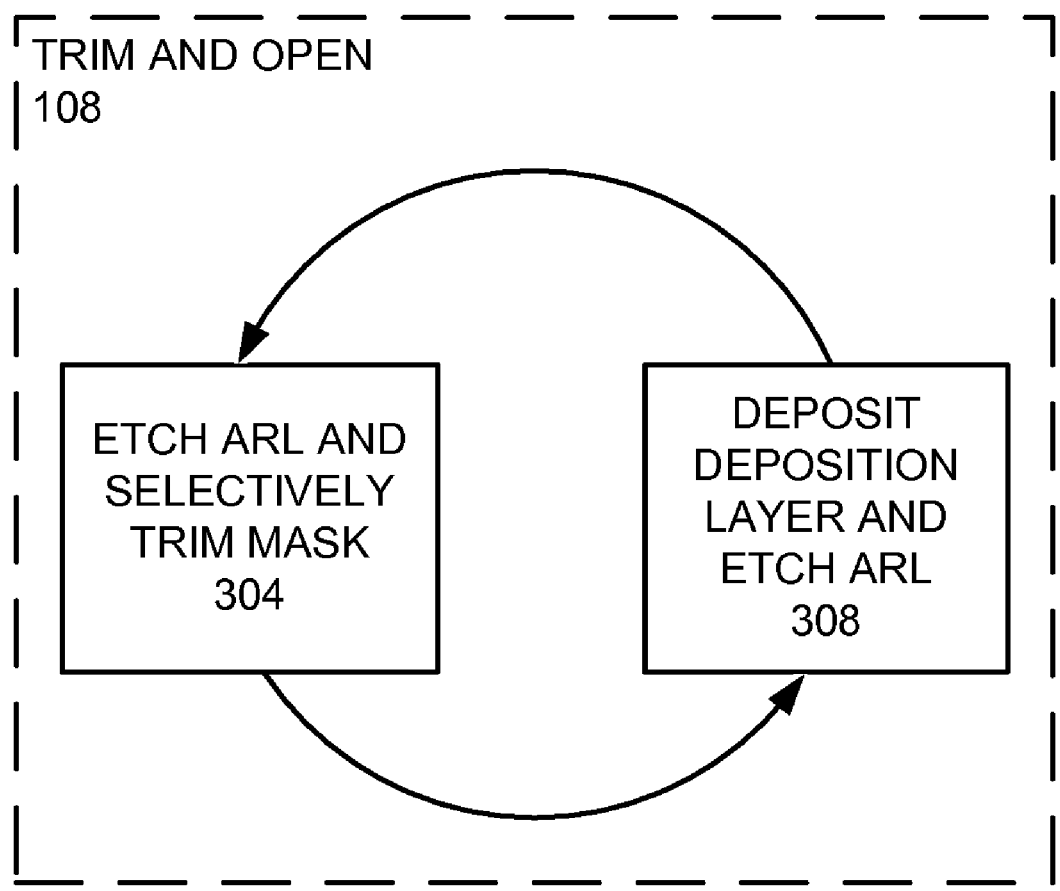
FIG. 3 is a more detailed flow chart of the trimming and opening step in accordance with an embodiment of the present invention.

FIG. 3 is a more detailed process flow chart of the multi-cycle process for the trimming and opening process. In this example, the trimming and opening process is performed in a plurality of two-phase cycles. The first phase (trim-etch phase) of each cycle etches the ARL 210 in the bottom of the mask features and also selectively trims the sidewall of the mask features in the isolated areas 216 with respect to the dense areas 218 (step 304). The second phase (deposition-etch phase) of each cycle deposits a deposition layer on the mask while further etching the ARL 210 in the bottom of the mask features (step 308). Each cycle of the trimming and opening step produces a net trimming of the mask in the isolated areas. Additional phases may be added to each cycle. The trimming and opening step includes two or more cycles, preferably at least three cycles. More preferably, this step includes four to twelve cycles. More preferably, the step repeats six to seven cycles.

In accordance with one embodiment of the present invention, the mask is a photoresist (PR), and the trim-etch phase (step 304) uses a trim-etch gas comprising $NF_3$. More preferably, the deposition gas further comprises a carrier gas, such as $N_2$ and/or Ar.

In this embodiment, the deposition-etch phase (step 308) uses a deposition-etch gas comprising $CF_4$, and deposits a polymer material as the deposition layer. The deposition-etch gas may be a combination of $CF_4$, $H_2$ and Ar, or a combination of $CF_4$, H2, $N_2$ and Ar.

Figure 4A:
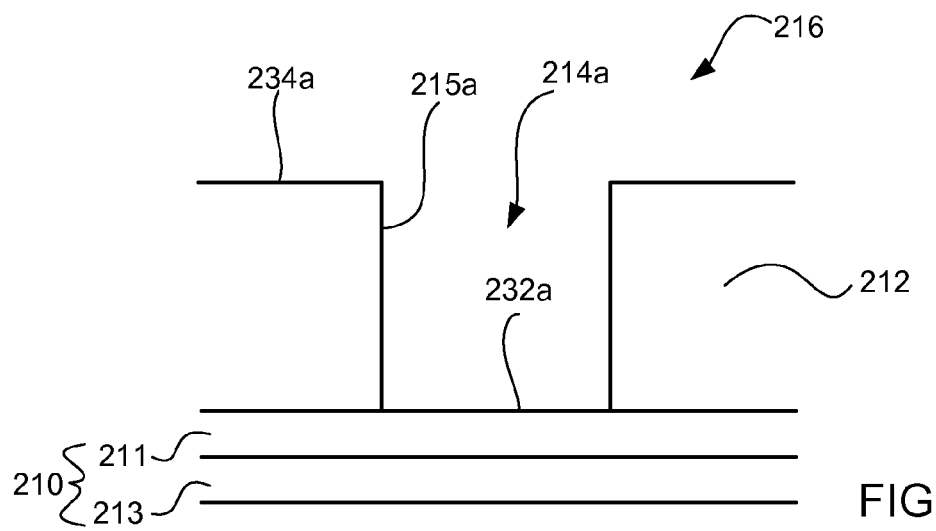
FIGS. 4A-C are schematic cross-sectional views of a mask feature in isolated areas (a large mask feature) processed according to an example of the invention.
Figure 4B:
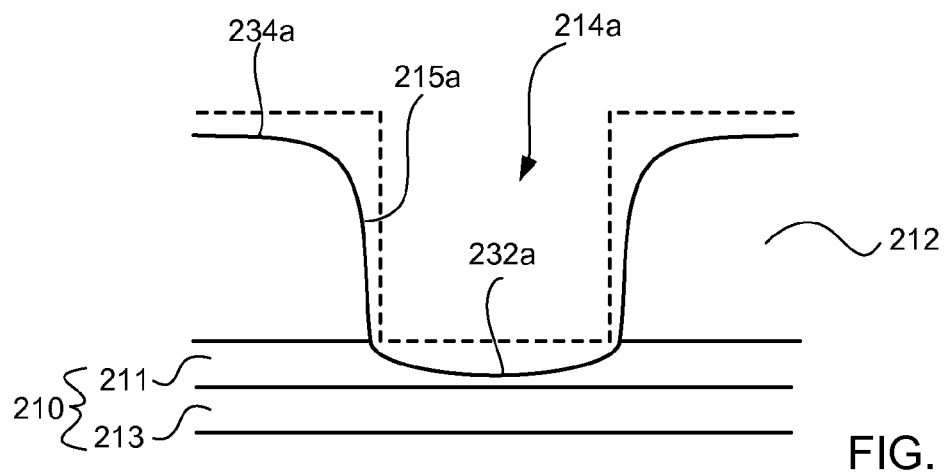
Figure 4C:
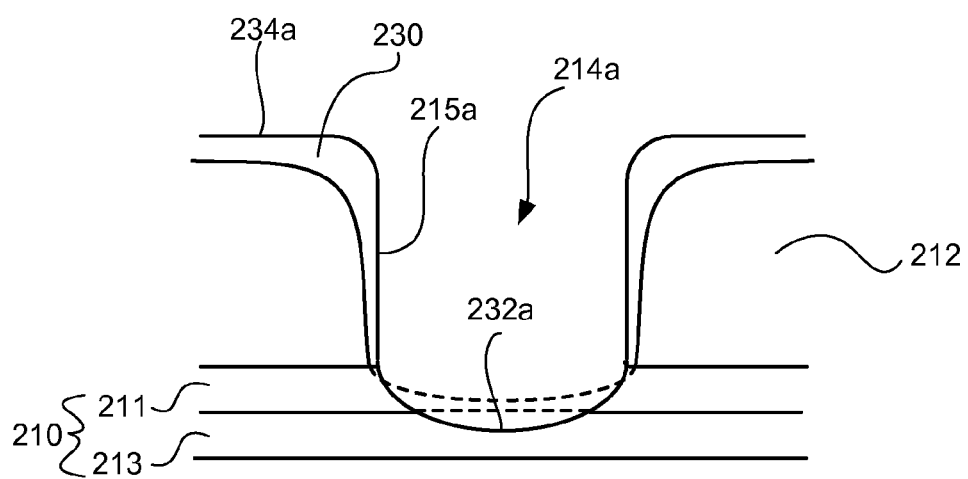
Figure 5A:
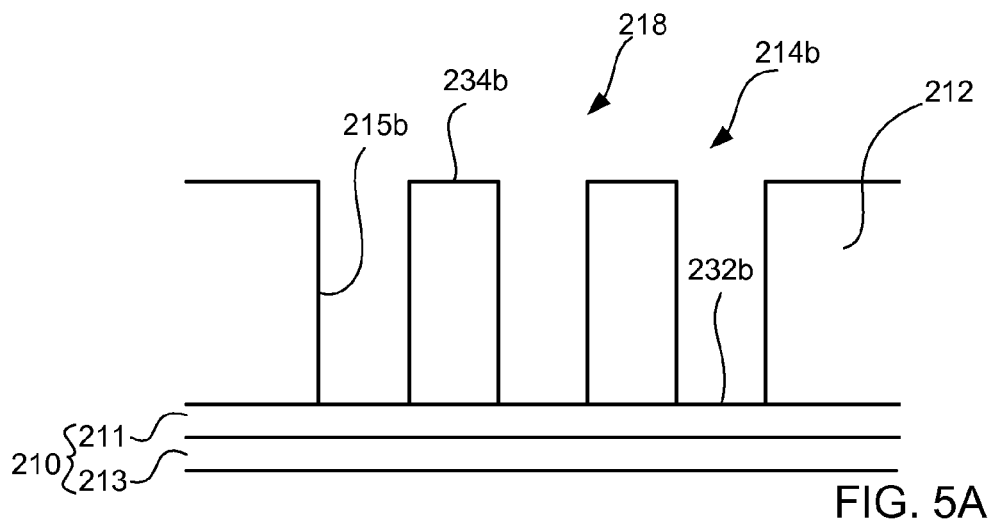
FIGS. 5A-C are schematic cross-sectional views of mask features in dense areas (small mask features) processed according to the example of the invention corresponding to FIGS. 4A-C.
Figure 5B:
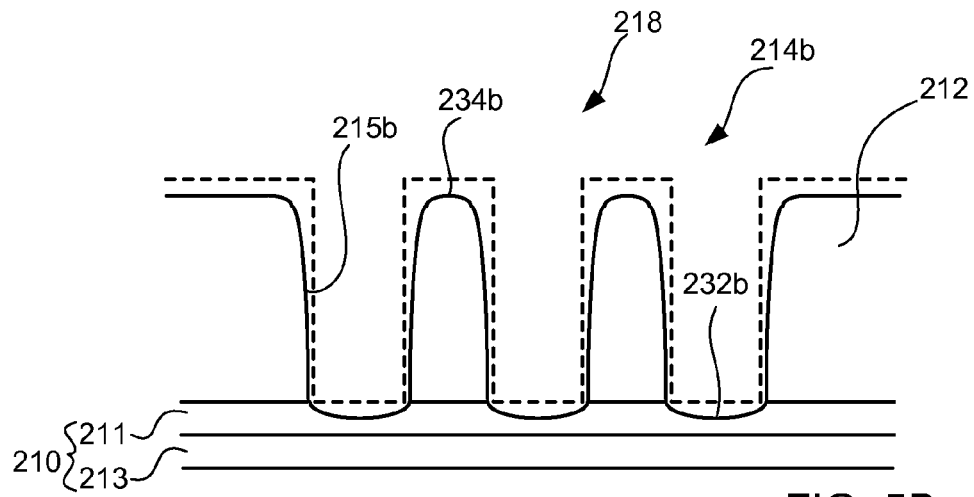
Figure 5C:
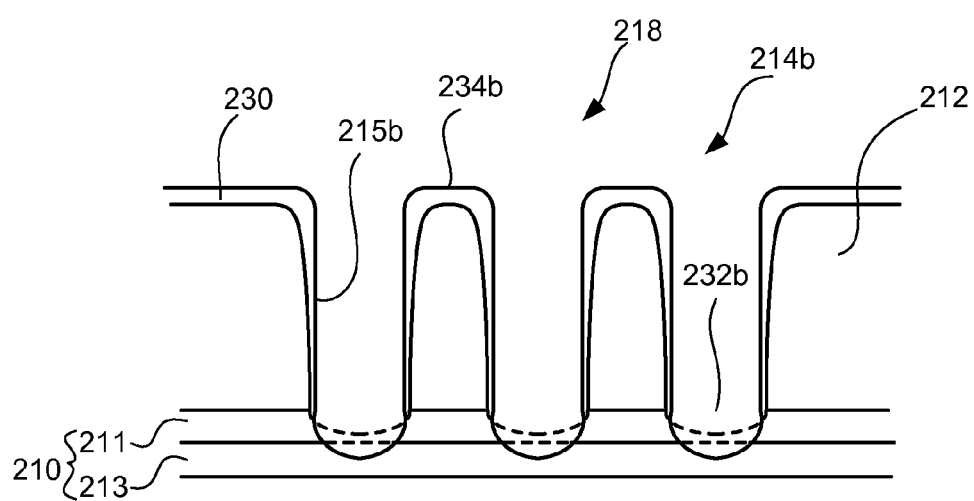

FIGS. 4A-4C schematically illustrates a cross sectional view of a mask feature 214a in the isolated areas 216 in each cycle of the trimming and opening step. Similarly, FIGS. 5A-5C schematically illustrates a cross sectional view of mask features 214b in the dense areas 218 in each cycle of the trimming and opening step. As shown in FIGS. 4A and 5A, the patterned mask 212 is formed over the ARL 210 over the dielectric layer 208. Typically, the ARL 210 includes an organic BARC 211 and an inorganic DARC 213. The Bark 211 is exposed in the bottom of the mask features.

As shown in FIGS. 4A and 4B, the trim-etch phase etches the ARL 210 in the bottoms 232a, 232b of the mask features 214a, 214b. This ARL etch is partial etch and does not completely remove the ARL 210 or BARC 211 in one cycle. In addition, the top 234a, 234b of the mask 212 and the side walls 215a and 215b of the mask features 214a and 214b are also partially removed. Since the trim-etch gas containing $NF_3$ has a higher etch rate in the isolated area 216 than the dense area 218, the sidewall 214a of the mask feature 214a in the isolated area 216 is reduced more than the sidewall 215b of the mask feature 214b in the dense area 218.

In the deposition-etch phase, the deposition-etch gas deposits a deposition layer 230 over the mask 212, covering the bottoms 232a and 232b of the mask features 214a, 214b as well as the sidewalls 215a and 215b of the mask features 214a, 214b, while further etching the ARL 210 in the bottom 232a and 232b of the mask features 214a and 214b, as shown in FIGS. 4C and 5C. The deposition layer 230 may be a hydrocarbon included polymer (a polymer containing hydrocarbon as a main component). In each deposition-etch phase, in general, the thickness of the deposition layer 230 deposited on the top 234a, 234b of the mask is greater than the thickness of the deposition layer deposited on the sidewalls 215a, 215b of the mask features. Furthermore, the deposition layer in the isolated area 216 may be thicker than the deposition layer in the dense area 218. The deposition-etch gas may also deposit more deposition material onto the sidewall 215a of mask features in the isolated areas 216 than on the sidewall 214b of the mask features in the dense areas 218.

In this example, each deposition-etch phase deposits the deposition layer 230 having the thickness substantially the same as the thickness of the mask removed by the previous trim-etch phase, as shown in FIGS. 4C and 5C. That is, at the end of each cycle, the original thickness of the mask 212 is substantially preserved by the deposition layer 230. However, as to the sidewalls of the mask features, since the microloading effect in the trim-etch process is more dominant than that in the deposition-etch process, the deposition layer on the sidewalls 215a of the mask features 214a in the isolated area 216 is still not sufficient to fully recover the lost sidewall during the previous trim-etch phase. Accordingly, in the isolated areas, as shown in FIG. 4C, the trimming and opening step reduces the sidewall of the mask while substantially preserving the original thickness of the mask, resulting in a net trim of the mask. In the dense areas, on the other hand, as shown in FIG. 5C, the original profile of the mask (i.e., the thickness of the mask and shape of the mask features) are substantially preserved. In either area, the ARL 210 in the bottom of the mask features is being etched throughout the trim-etch and deposition-etch phases.

Accordingly, by controlling the two phases in the trimming and opening step, the sidewalls 215a of the mask features 214a in the isolated areas 216 are selectively trimmed with respect to the dense areas 218 while opening the ARL 210 from the bottom of the mask features and preserving the original thickness of the mask 212.

Figure 6A:
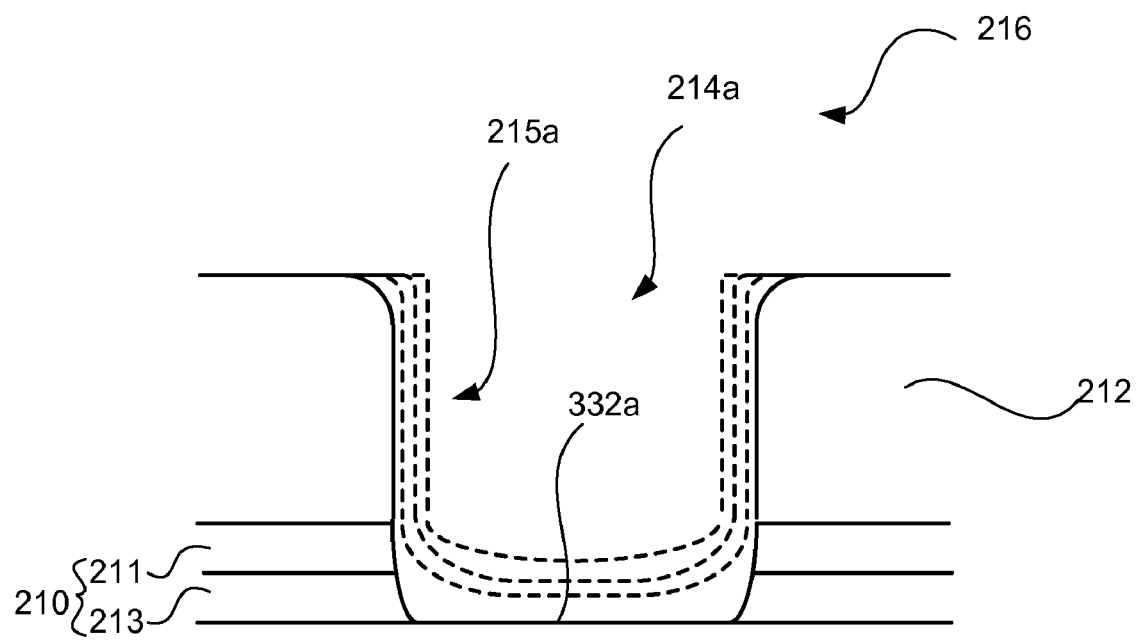
FIG. 6A is a schematic cross-sectional view of the mask feature in the isolated areas (a large mask feature) after a plurality of cycles of the trimming and opening step.
Figure 6B:
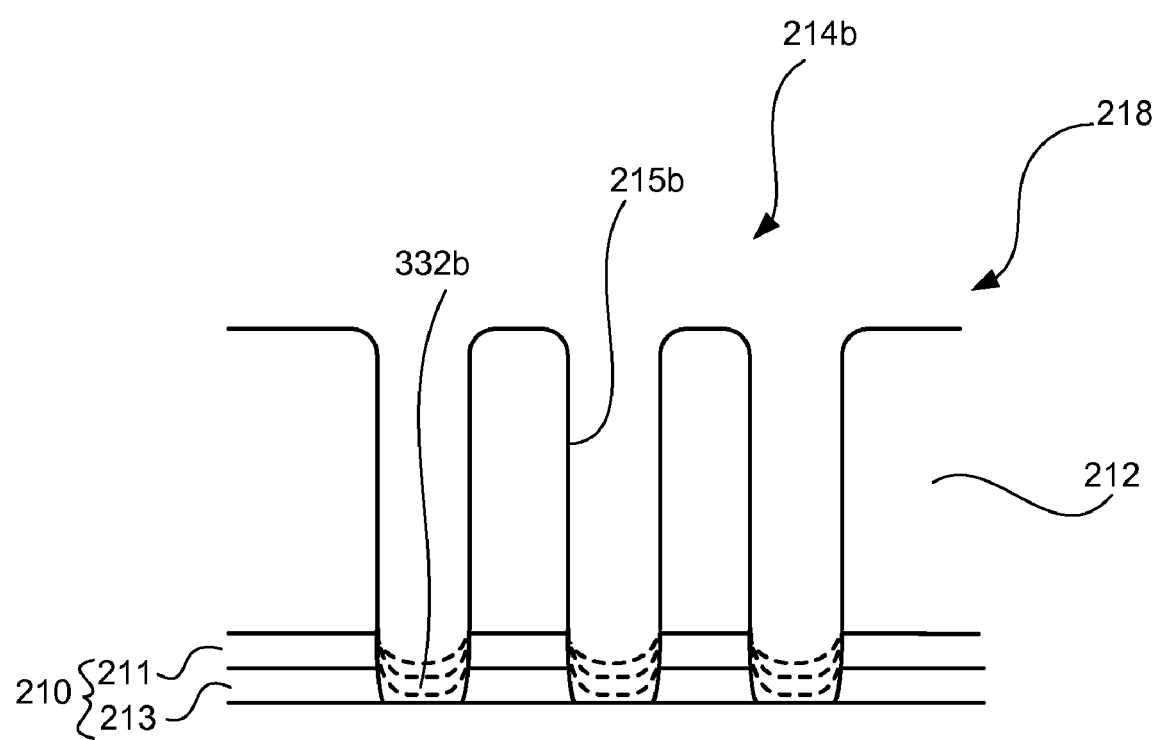
FIG. 6B is a schematic cross-sectional view of the mask feature in the dense areas (small mask features) after a plurality of cycles of the trimming and opening step.

FIG. 6A schematically illustrates a cross sectional view of the mask feature 214a in the isolated areas 216 after a plurality of cycles of the trimming and opening step. By repeating the trim-etch phase and the deposition-etch phase, the sidewalls 215a of the mask features 214 in the isolated areas are trimmed little by little down to a desired profile. At the same time, the ARL 210 in the bottom of the mask features 214a is opened for the subsequent etch process of the dielectric layer. FIG. 6B schematically illustrates a cross sectional view of the mask feature 214b in the dense areas 218 after a plurality of cycles of the trimming and opening step. In dense areas 218, the ARL 210 are opened in the bottom of the mask features, but the mask substantially maintains its original thickness and mask feature profile.

Figure 7A:
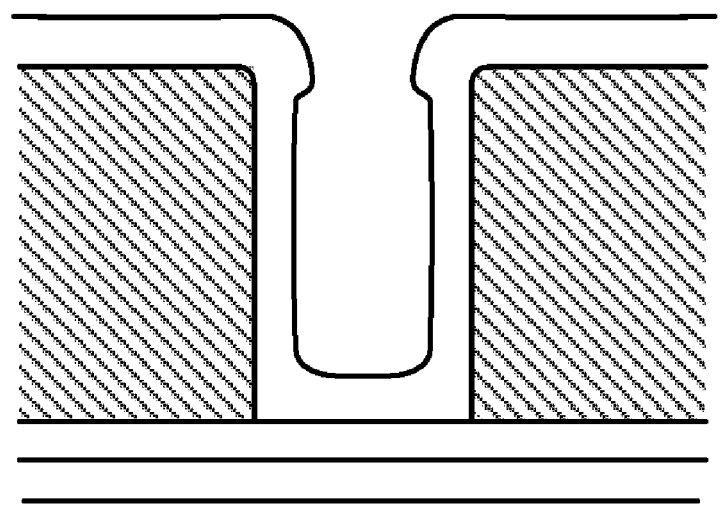
FIGS. 7A-B are schematic cross-sectional views of a mask feature having a bread-loafed profile and a faceted profile, respectively.
Figure 7B:
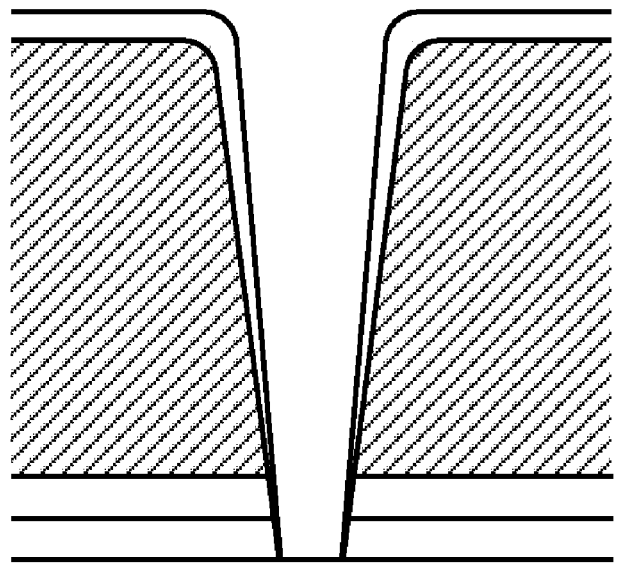

It should be noted that repeating a plurality of cycles for depositing a thin deposition layer in each deposition-etch phase (multi-cycle process) has several advantages over depositing a thick deposition layer at a time after a large amount of trim and opening. First, the multi-cycle process provides better profile tuning. A single long deposition-etch step to deposit a thicker polymer layer tends to produce a so called "bread-loaf" profile (as shown in FIG. 7A) and in extreme cases the feature may even be pinched off. On the other hand, a single long trim-etch step would produce a faceted profile (as shown in FIG. 7B). A plurality of cycles of alternating trim-etch step and deposition-etch step gives better profile control with minimal or no bread-loafing and straighter side walls. In addition, the polymer layer becomes densified, minimizing delamination, striation, or blistering (peeling-off). For example, a thick deposition layer, for example, more than 200 nm, tends to peel off from the mask especially at the edge of the mask features. In addition, it should be noted that it is not desirable or practical to change the CD of the original mask features in the isolated area because of the requirement of the design rule.

Figure 2C:
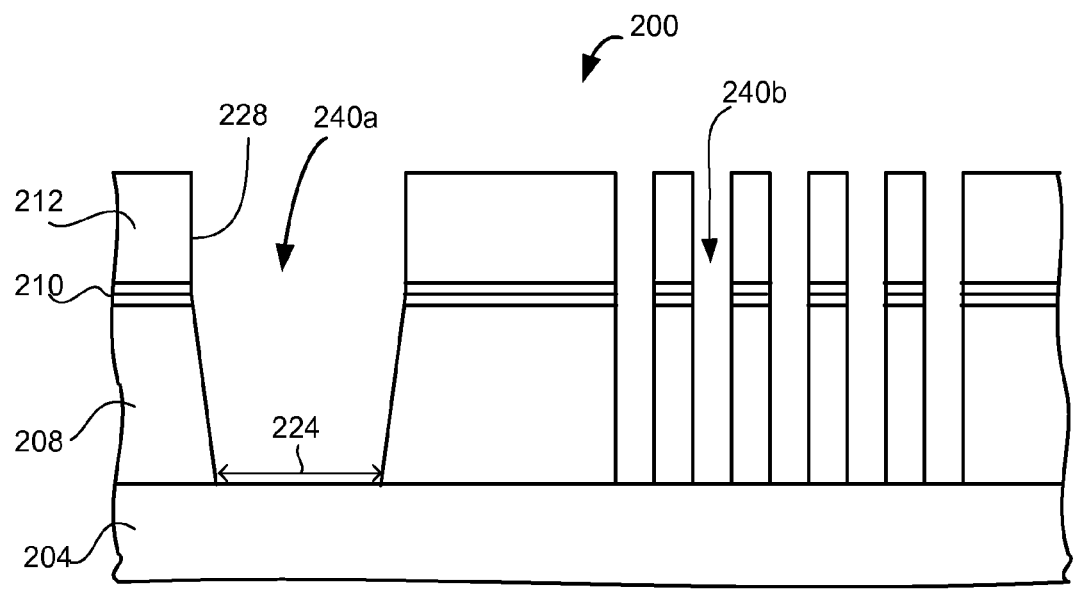

Returning to FIG. 1, after the trimming and opening (step 108), features are etched into the dielectric layer 208 through the trimmed mask (step 112). FIG. 2C shows features 240 (240a, 240b) etched into the dielectric layer 208.

Figure 2D:
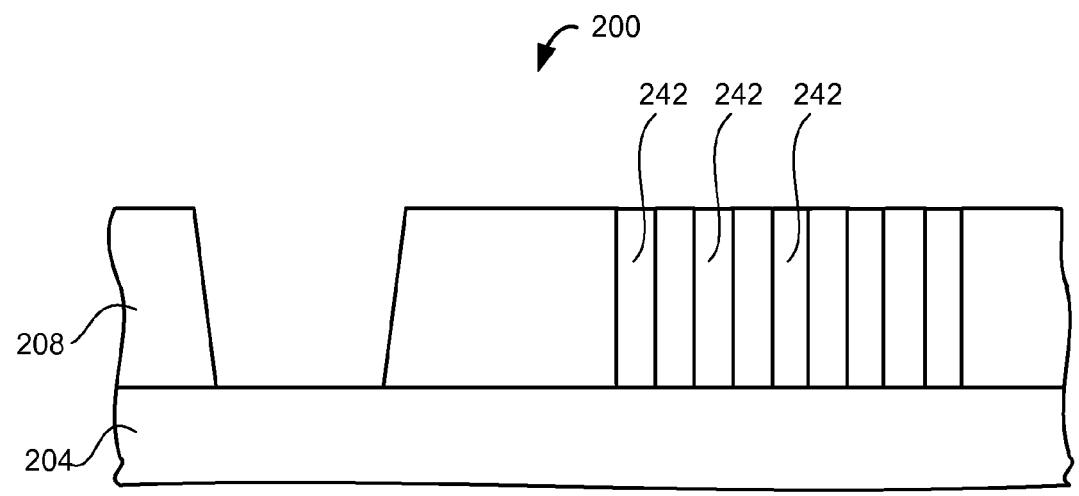

Returning to FIG. 1, the mask 212 and the ARL 210 are then stripped (step 116). FIG. 2D shows the stack 200 after the mask 212 and the ARL 210 have been removed. Additional formation steps may be performed (step 124). For example, contacts 242 may then be formed in the features. Additional processes may be performed after the contact is formed.

Figure 8:
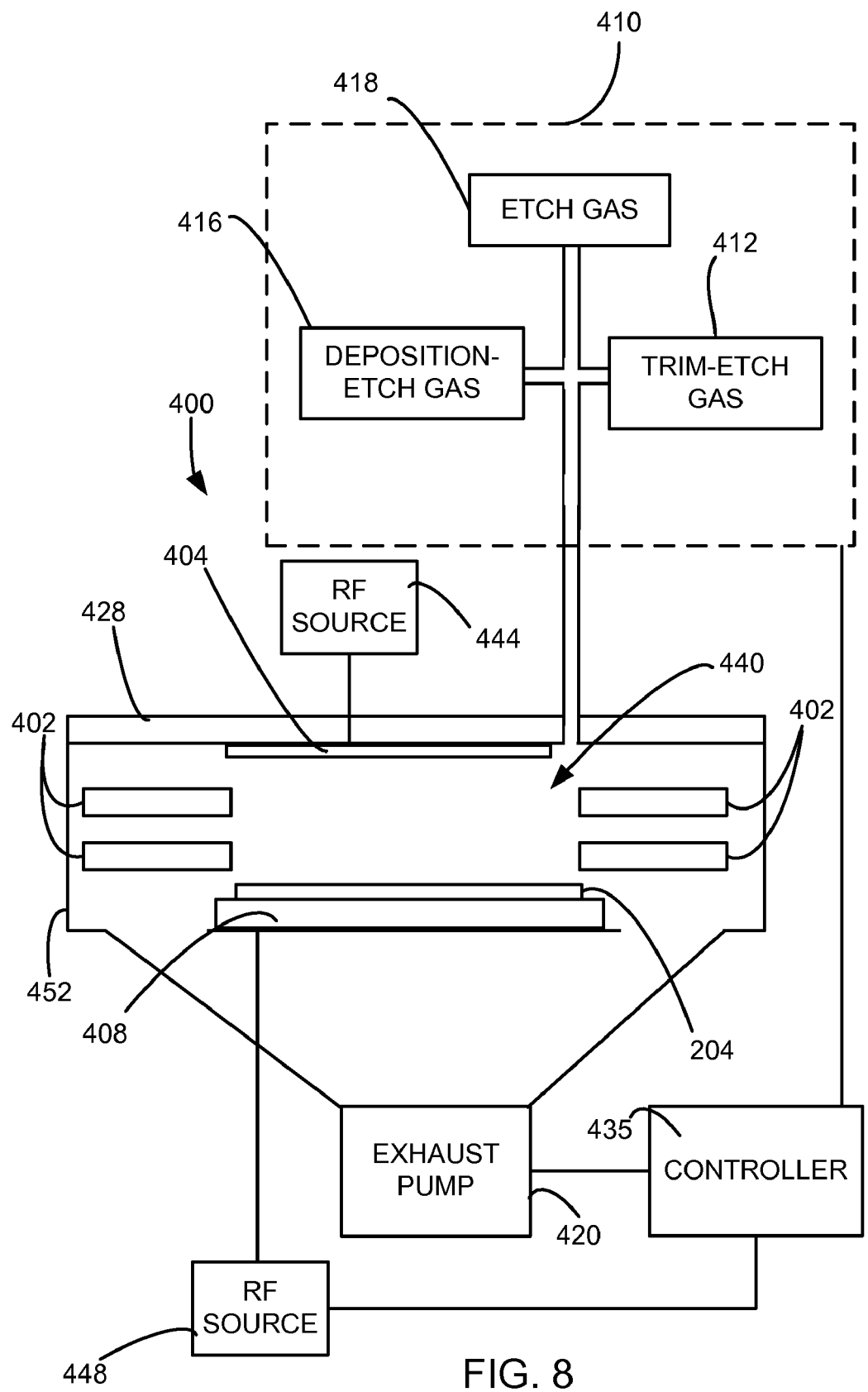
FIG. 8 is a schematic view of a plasma processing chamber that may be used in practicing the invention.

FIG. 8 is a schematic view of a processing chamber 400 that may be used for the trimming and opening described above, including a first phase for etching the ARL and selectively trimming the mask, and a second phase for depositing the deposition layer and further etching the ARL. The plasma processing chamber 400 comprises confinement rings 402, an upper electrode 404, a lower electrode 408, a gas source 410 connected through a gas inlet, and an exhaust pump 420 connected to a gas outlet. The gas source 410 comprises a trim-etch gas source 412 and a deposition-etch gas source 416. Preferably, the processing chamber 400 is able to etch a dielectric layer. More preferably, the processing chamber 400 can also strip the mask (and ARL) such that mask-trimming, dielectric etch, and mask-stripping are done in situ. Thus, the gas source 410 may comprise additional gas sources, such as an etching gas source 418 for the dielectric layer, and a gas source for mask stripping (not shown).

Within plasma processing chamber 400, the substrate 204 is positioned upon the lower electrode 408. The lower electrode 408 incorporates a suitable substrate chucking mechanism (e.g., electrostatic, mechanical clamping, or the like) for holding the substrate 204. The reactor top 428 incorporates the upper electrode 404 disposed immediately opposite the lower electrode 408. The upper electrode 404, lower electrode 408, and confinement rings 402 define the confined plasma volume. Gas is supplied to the confined plasma volume by the gas source 410 and is exhausted from the confined plasma volume through the confinement rings 402 and an exhaust port by the exhaust pump 420. A first RF source 444 is electrically connected to the upper electrode 404. A second RF source 448 is electrically connected to the lower electrode 408. Chamber walls 452 surround the confinement rings 402, the upper electrode 404, and the lower electrode 408. Both the first RF source 444 and the second RF source 448 may comprise a 27 MHz power source, a 2 MHz power source, and a 60 MHz power source. Different combinations of connecting RF power to the electrode are possible. In the case of Lam Research Corporation's Dielectric Etch Systems such as Exelan® Series, made by LAM Research Corporation™ of Fremont, Calif., which may be used in a preferred embodiment of the invention, both the 27 MHz, 2 MHz, and 60 MHz power sources make up the second RF power source 448 connected to the lower electrode, and the upper electrode is grounded. A controller 435 is controllably connected to the RF sources 444, 448, exhaust pump 420, and the gas source 410. The Dielectric Etch System would be used when the layer to be etched 208 is a dielectric layer, such as silicon oxide or organo silicate glass. The controller 435 controls the RF sources 444, 448, exhaust pump 420, the trim-etch gas source 412, and the deposition-etch gas source 416, and alternately performs trim-etching and deposition-etching as two phases of each cycle of a plurality of cycles, such that the trim-etching and the deposition-etching result in a net trimming of the mask in the isolated areas.

Figure 9A:
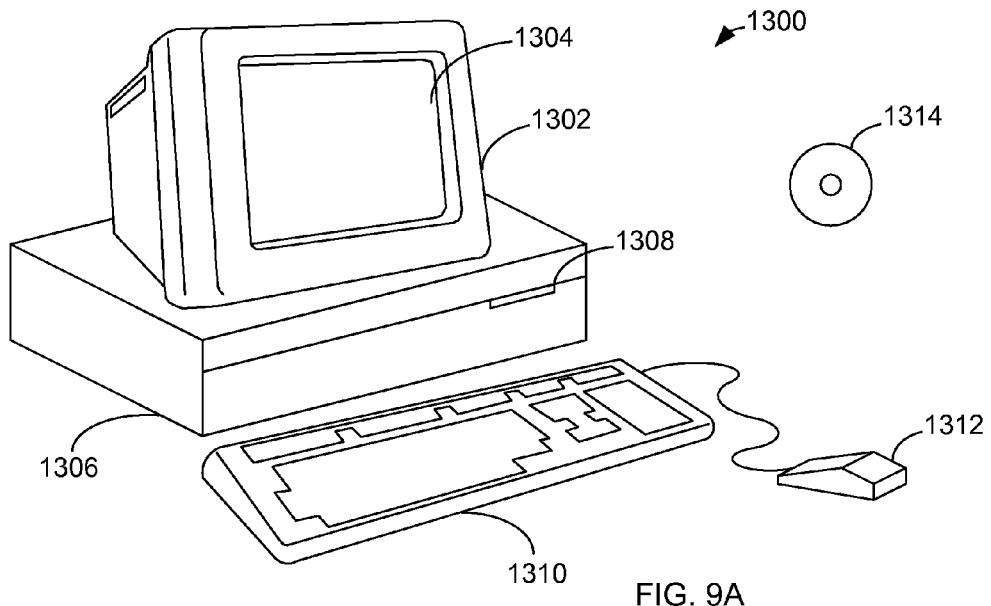
FIGS. 9A-B illustrate a computer system, which is suitable for implementing a controller used in embodiments of the present invention.
Figure 9B:
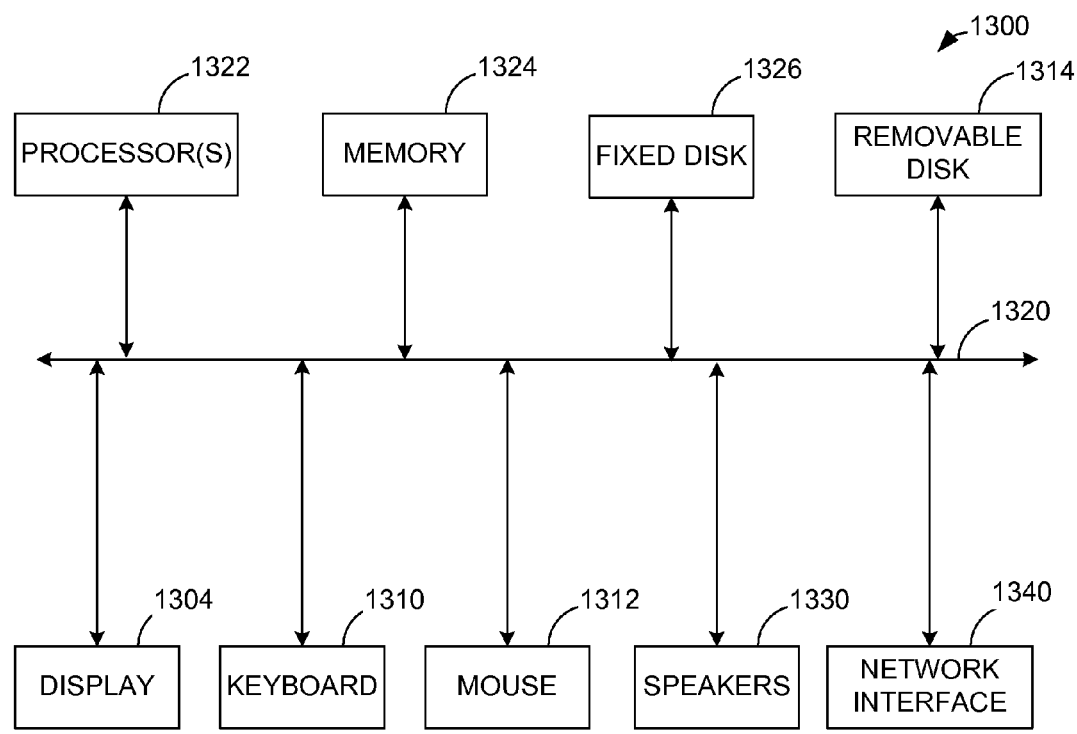

FIGS. 9A and 9B illustrate a computer system 1300, which is suitable for implementing a controller 435 used in embodiments of the present invention. FIG. 9A shows one possible physical form of the computer system. Of course, the computer system may have many physical forms ranging from an integrated circuit, a printed circuit board, and a small handheld device up to a huge super computer. Computer system 1300 includes a monitor 1302, a display 1304, a housing 1306, a disk drive 1308, a keyboard 1310, and a mouse 1312. Disk 1314 is a computer-readable medium used to transfer data to and from computer system 1300.

FIG. 9B is an example of a block diagram for computer system 1300. Attached to system bus 1320 is a wide variety of subsystems. Processor(s) 1322 (also referred to as central processing units, or CPUs) are coupled to storage devices, including memory 1324. Memory 1324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1326 is also coupled bi-directionally to CPU 1322; it provides additional data storage capacity and may also include any of the computer-readable media described below. Fixed disk 1326 may be used to store programs, data, and the like and is typically a secondary storage medium (such as a hard disk) that is slower than primary storage. It will be appreciated that the information retained within fixed disk 1326 may, in appropriate cases, be incorporated in standard fashion as virtual memory in memory 1324. Removable disk 1314 may take the form of any of the computer-readable media described below.

CPU 1322 is also coupled to a variety of input/output devices, such as display 1304, keyboard 1310, mouse 1312, and speakers 1330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1322 may optionally be coupled to another computer or telecommunications network using network interface 1340. With such a network interface, it is contemplated that the CPU might receive information from the network, or might output information to the network in the course of performing the above-described method steps. Furthermore, method embodiments of the present invention may execute solely upon CPU 1322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

A multiple cycle two phase process is used to perform the trimming and opening (step 108 in FIG. 1) in which the sidewalls of the mask features in isolated areas (large mask features) are selectively trimmed with respect to dense areas (small mask features), while the ARL in the bottom of the features is being etched. In accordance with one embodiment of the present invention, where the mask is a photoresist, the first phase (trim-etch phase) provides a trim-etch gas containing $NF_3$. An example of a trim-etch phase (step 304) provides a flow of 100-500 sccm, preferably 300 sccm $NF_3$. The pressure is set to 140 mTorr. The substrate is maintained at a temperature of 20° C. The second RF source 448 provides 400 Watts at a frequency of 60 MHz. In other embodiments, the second FR source 448 may provide 100-500 Watts at a frequency of 2 MHz, or 100-500 Watts at a frequency of 27 MHz, depending on the wafer and application. In a preferred embodiment, $NF_3$ is the only component of the trim-etch gas without any carrier or tuning gas. In each trim-etch phase, after the $NF_3$-containing trim-etch gas is introduced into the chamber, a trim-etch plasma is formed therefrom to selectively trim the mask and etch the ARL, as described above. The flow of the trim-etch gas is stopped such that the sidewall of the mask features is reduced by a desired amount for the cycle. The amount of the reduced sidewall may be controlled by the time period of the trim-etch phase for a given set the parameters such as gas flow rate, pressure, and the RF power, as well as the thickness of the ARL.

An example of deposition-etch phase (step 308) provides a $CF_4$ containing gas, such as 20-200 sccm $CF_4$ and 20-200 sccm $H_2$ as a deposition-etch gas, and a carrier gas containing 20-200 sccm $N_2$ and/or 50-500 sccm Ar. Preferably, the deposition-etch gas includes 60 sccm $CF_4$, 70 sccm $H_2$, 30 sccm $N_2$, with the carrier gas of 120 sccm Ar. A pressure of 40-200 mTorr, preferably 80 mTorr is provided to the chamber. The second RF source 448 provides 100-500 Watts, preferably 400 Watts at a frequency of 60 MHz. In other embodiments, the second FR source 448 may provide 100-500 Watts at a frequency of 2 MHz, or 100-500 Watts at a frequency of 27 MHz, depending on the wafer and application. In other embodiments, each cycle may further include additional deposition and/or profile shaping phases. In each deposition-etch phase, after the $CF_4$-containing etch gas is introduced into the chamber, a plasma is formed therefrom to deposit a deposition layer and further etch the ARL as described above. The flow of the $CF_4$-containing etch gas is stopped such that the deposition layer recovers the thickness of the mask lost in the previous trim-etch phase. The amount of the net trim of the cycle may be controlled by the time period of the trim-etch phase and the deposition-etch phase for a given set the parameters such as gas flow rate, pressure, and the RF power, as well as the thickness of the ARL. In general, the longer the trim-etch phase, the longer the deposition-etch phase. By controlling the two phases of each cycle as well as the number of cycles, at the end of the trimming and opening step, the ARL in the bottom of the mask features are removed and the sidewalls of the features in the isolated areas are trimmed to compensate the micro-loading effect in the subsequent dielectric etch.

An example of a dielectric layer 208 to be etched may be a conventional etch layer, such as SiN, SiC, an oxide, or low-k dielectric. A conventional etch recipe may be used to etch the layer to be etched.

To strip the mask and the ARL (step 116) an oxygen ashing may be used.

As described above, the trimming and opening process which combines the trim-etch phase and the deposition-etch phase during the removal of the ARL enables the control of CD bias between the isolated areas (large features) and the dense areas (small features) in the subsequent etch of the dielectric layer. The trim-etch and deposition etch cycle can be repeated as many times as desired to obtain the ideal trim of the mask to realize the target CD of the dielectric layer and remove the ARL in the bottom of the mask features. The trimming and opening which provides the enlarged CD of the isolated area (i.e., "negative micro-loading" until the ARL etch) compensate the micro-loading effect during the etch of the dielectric layer so as to realize the target CD in the final features.

While this invention has been described in terms of several preferred embodiments, there are alterations, modifications, modifications, permutations, and various substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and various substitute equivalents as fall within the true spirit and scope of the present invention.

What is claimed is:

1. A method for etching a dielectric layer disposed below an antireflection layer (ARL), the method comprising:
    forming a patterned mask with mask features over the ARL, the mask having isolated areas and dense areas of the mask features;
    trimming and opening comprising a plurality of cycles, each cycle comprising:
        a trim-etch phase which etches the ARL in a bottom of the mask features and selectively trims the isolated areas of the mask with respect to the dense areas; and
        a deposition-etch phase which deposits a deposition layer on the mask while further etching the ARL in the bottom of the mask features, wherein the trimming and opening result in a net trimming of the mask in the isolated areas; and
    etching the dielectric layer using the trimmed mask.

2. The method as recited in claim 1, wherein the patterned mask is a photoresist mask.

3. The method as recited in claim 2, wherein the ARL includes an organic bottom antireflective coating (BARC) and an inorganic dielectric antireflective coating (DARC).

4. The method as recited in claim 1, wherein the deposition-etch phase deposits a polymer material as the deposition layer.

5. The method as recited in claim 4, wherein the deposition-etch phase deposits the deposition layer that substantially recovers a thickness of the mask removed in the previous trim-etch phase.

6. The method as recited in claim 1, wherein the trimming and opening substantially preserves an original thickness of the mask and reduces a sidewall of the mask in the isolated pattern area.

7. The method as recited in claim 6, wherein the trimming and opening substantially preserves an original profile of the mask in a dense pattern area.

8. The method as recited in claim 1, wherein the trim-etch phase comprises:
    providing a trim-etch gas comprising $NF_3$;
    forming a plasma from the trim-etch gas; and
    stopping a flow of the trim-etch gas.

9. The method as recited in claim 8, wherein the deposition-etch phase comprises:
    providing a deposition-etch gas comprising $CF_4$;
    forming a plasma from the deposition-etch gas; and
    stopping a flow of the deposition-etch gas.

10. The method as recited in claim 9, wherein the deposition-etch gas further comprises:
    $H_2$; and
    a carrier gas including at least one of $N_2$ or Ar.

11. The method as recited in claim 1, wherein the trimming and opening comprises at least three cycles.

12. The method as recited in claim 11, wherein the trimming and opening comprises four to twelve cycles.

13. The method as recited in claim 12, wherein the trimming and opening comprises six to seven cycles.

14. An apparatus for etching a dielectric layer disposed below an antireflection layer (ARL) and a patterned mask with mask features formed over the ARL, the mask having isolated areas and dense areas of the mask features, the apparatus comprising:
    a plasma processing chamber, comprising:
        a chamber wall forming a plasma processing chamber enclosure;
        a substrate support for supporting a substrate within the plasma processing chamber enclosure;
        a pressure regulator for regulating the pressure in the plasma processing chamber enclosure;
        at least one electrode for providing power to the plasma processing chamber enclosure for sustaining a plasma;
        a gas inlet for providing gas into the plasma processing chamber enclosure; and
        a gas outlet for exhausting gas from the plasma processing chamber enclosure;
    a gas source in fluid connection with the gas inlet, comprising;
        a trim-etch gas source;
        a deposition-etch gas source; and
        a dielectric layer etch gas source;
    a controller controllably connected to the gas source and the at least one electrode, comprising:
        at least one processor; and
        non-transitory computer readable media comprising:
            computer readable code for trimming and opening comprising a plurality of cycles, wherein computer readable code for each cycle comprising:
                computer readable code for providing a trim-etch gas from the trim-etch gas source to form a deposition layer;
                computer readable code for generating a first plasma from the trim-etch gas, the first plasma etching the ARL in a bottom of the mask features and selectively trimming the isolated areas of the mask with respect to the dense areas;
                computer readable code for stopping the trim-etch gas from the trim-etch gas source;
                computer readable code for providing a deposition-etch gas from the deposition-etch gas source;

computer readable code for generating a second plasma from the deposition-etch etch gas source, the second plasma depositing a deposition layer on the mask while further etching the ARL in the bottom of the mask features;

computer readable code for stopping the deposition-etch gas from the deposition-etch gas source;

computer readable code for etching the dielectric layer using the trimmed mask; and computer readable code for removing the mask.

\* \* \* \* \*